United States Patent
Nazarian et al.

(10) Patent No.: US 9,600,410 B1
(45) Date of Patent: Mar. 21, 2017

(54) RERAM BASED NAND LIKE ARCHITECTURE WITH CONFIGURABLE PAGE SIZE

(71) Applicant: Crossbar, Inc., Santa Clara, CA (US)

(72) Inventors: Hagop Nazarian, San Jose, CA (US); Cliff Zitlaw, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 114 days.

(21) Appl. No.: 14/475,395

(22) Filed: Sep. 2, 2014

Related U.S. Application Data

(60) Provisional application No. 61/987,420, filed on May 1, 2014.

(51) Int. Cl.
  *G06F 12/02* (2006.01)
(52) U.S. Cl.
  CPC .. *G06F 12/0246* (2013.01); *G06F 2212/7201* (2013.01)
(58) Field of Classification Search
  CPC ............. G06F 12/0238; G06F 12/0246; G06F 2212/2024; G06F 2212/7201; G06F 12/7203
  USPC .................................... 710/53; 711/103, 209
  See application file for complete search history.

(56) References Cited

U.S. PATENT DOCUMENTS

| | | | | |
|---|---|---|---|---|
| 6,469,955 | B1* | 10/2002 | Tsao ..................... | G11C 7/1042 365/185.17 |
| 2008/0123391 | A1* | 5/2008 | Cho ..................... | G11C 7/1051 365/148 |
| 2009/0282185 | A1* | 11/2009 | Van Cauwenbergh ..... | G06F 12/0246 711/103 |
| 2010/0262763 | A1* | 10/2010 | Liu ..................... | G06F 11/1048 711/103 |
| 2011/0307762 | A1* | 12/2011 | Tiziani ................... | G06F 11/10 714/768 |
| 2014/0379962 | A1* | 12/2014 | Lasser ................. | G06F 12/0246 711/103 |
| 2015/0029777 | A1* | 1/2015 | Chung ................... | G11C 17/18 365/96 |
| 2015/0117095 | A1* | 4/2015 | Dray ................... | G11C 11/1675 365/158 |

* cited by examiner

*Primary Examiner* — Gary Portka
(74) *Attorney, Agent, or Firm* — Amin, Turocy & Watson, LLP

(57) ABSTRACT

Providing a RRAM based memory storage device that has a NAND memory type architecture with a configurable page size. In an embodiment, two memory registers can be used to access and transfer data stored in the storage device to a host. A memory controller on the storage device can determine a page size of the host, and alternately transfer data from the first register and then the second register until an amount of data transferred equals the page size of the host. The memory controller can send the data to the host as if the data belonged to one page transfer. In this way, the memory controller creates a virtualized page size based on the requirements of the host.

20 Claims, 10 Drawing Sheets

RERAM BASED NAND LIKE ARCHITECTURE WITH CONFIGURABLE PAGE SIZE

CROSS-REFERENCE TO RELATED APPLICATIONS

The present application for patent claims the benefit of U.S. Provisional Application Ser. No. 61/987,420 entitled RERAM BASED NAND LIKE ARCHITECTURE WITH CONFIGURABLE PAGE SIZE and filed May 1, 2014, which is incorporated by reference herein in its entirety and for all purposes. This application is related to U.S. application Ser. No. 13/529,985, filed Jun. 21, 2012 and U.S. application Ser. No. 14/072,657, filed Nov. 5, 2013, which is a continuation of U.S. application Ser. No. 13/725,331 filed Dec. 21, 2012, now U.S. Pat. No. 8,750,019, that is a continuation of U.S. application Ser. No. 12/833,898, filed Jul. 9, 2010, now. U.S. Pat. No. 8,374,018. These applications are incorporated by reference herein in its entirety and for all purposes.

TECHNICAL FIELD

The subject disclosure relates generally to non-volatile memory, and as one illustrative example, a non-volatile, resistive random access memory based NAND like architecture that facilitates a configurable page size.

BACKGROUND

A recent innovation within the field of integrated circuit technology is resistive-switching memory. While much of resistive-switching memory technology is in the development stage, various technological concepts for resistive-switching memory have been demonstrated and are in one or more stages of verification to prove or disprove associated theory(ies). Even so, resistive-switching memory technology promises to hold substantial advantages over competing technologies in the semiconductor electronics industry.

Resistive random access memory (RRAM) is one type of resistive memory that has generated significant interest. RRAM has the potential to be a high density non-volatile information storage technology to further the drive toward increasingly higher density semiconductor-based devices. Generally, RRAM stores information by controllably switching among distinct resistive states. One theoretical example of an RRAM device includes an insulator layer provided between a pair of electrodes. Such a device properly configured can exhibit electrical pulse-induced hysteretic resistance switching effects.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide a solid state non-volatile memory storage comprising a memory bank of two-terminal memory elements. A page buffer is also included that comprises a subset of the two-terminal memory elements, wherein the page buffer has a plurality of memory registers that alternately transfer data from the memory bank to a system memory. A controller is also provided that determines a page size associated with a host request and iteratively transfers data from the memory registers until an amount of data transferred is equal to the determined page size.

Various embodiments also provide for a method that includes receiving a data access request to data stored in a memory bank of resistive random access memory. The method includes determining a page size associated with the data access request. The method also includes transferring data from a set of two or more registers where the transferring the data includes alternating between the registers until an amount of data transferred equals the determined page size.

A method for fabricating a solid state non-volatile memory storage drive is also included. The method includes creating multiple two-terminal memory cells arranged in an array with respect to wordlines and bitlines on a substrate. The method further includes connecting respective ones of a set of local wordlines to respective groups of two-terminal memory cells on a single wordline of the wordlines. The method also includes providing a set of input-output interfaces that supply electrical power concurrently to a plurality of the bitlines or to a plurality of the wordlines and providing two or more memory registers to facilitate transferring data. The method also includes providing a memory controller that facilitates alternating the transferring the data from each memory register until an amount of data transferred equals a page size associated with an access request.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
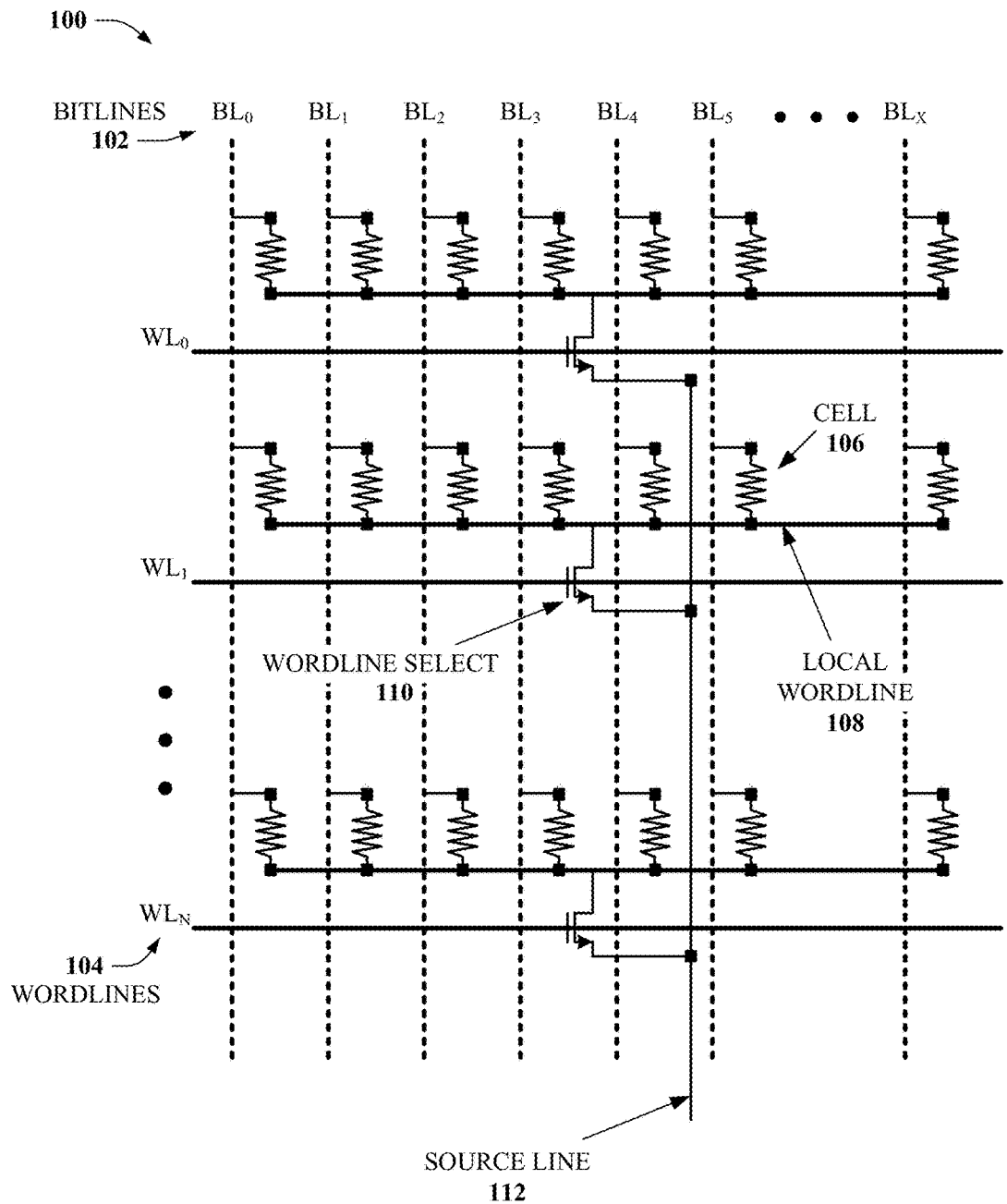
FIG. 1 illustrates a schematic diagram of an example memory circuit disclosed aspects.

This disclosure relates to two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

In various embodiments of the subject disclosure, a RRAM based memory storage device can have a NAND memory type architecture with a configurable page size. In an embodiment, two memory registers can be used to access and transfer data stored in the storage device to a host. A memory controller on the storage device can determine a page size of the host, and alternately transfer data from the first register and then the second register until an amount of data transferred equals the page size of the host. The memory controller can send the data to the host as if the data belonged to one page transfer. In this way, the memory controller creates a virtualized page size based on the requirements of the host.

The subject disclosure provides for two-terminal memory structures that provide a NAND like architecture that has a configurable page size. In some aspects, the two-terminal memory can comprise >20 nanometer (nm) process nodes whereas in other aspects the two-terminal memory can comprise sub-20 nanometer (nm) technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on.

In additional embodiments disclosed herein, there is provided a digital storage device comprising two-terminal memory. In some embodiments, such a digital storage device can be removably connected to a computing device (e.g., a host computer). In other embodiments, the digital storage device can be integrated with the computing device (e.g., read only memory, random access memory, etc.). In particular embodiments, the digital storage device can be a FLASH drive that can be connected to a host computer over a memory interface (e.g., a host interface such as a universal serial bus [USB], or other suitable interface; see, e.g., FIGS. 9 and 10, infra) and can store and retrieve information, and erase stored information, in response to commands by the host device.

FLASH memory technology has two primary distinct logical architectures, the NAND and the NOR architecture, both based on different arrangements of semiconductor transistors. Each of the logical architectures has different attributes, including advantages and drawbacks, with respect to the other. NAND is the most commonly used in consumer FLASH drive applications, however, largely because of its superior scalability and memory density.

One limitation of NAND FLASH technology is that a page of memory (e.g., memory cells connected to a single global wordline of a memory device, e.g., four kilobits [kb]) cannot be directly altered or rewritten without processing an entire block of the memory (e.g., two megabits [Mb]). Furthermore, multiple block-processes are involved in rewriting the page of memory. As an example, altering a page of memory can involve backing up the block in which the page of memory resides, erasing the block, and writing the backed-up data—including revisions to the page of memory—back to the block. As this example illustrates, NAND FLASH cannot be updated without first being erased, regardless of memory granularity (e.g., block, page, word, byte, bit, etc.).

In addition to the foregoing, NAND FLASH degrades after a relatively low number of program/erase (P/E) cycles. As a result, NAND devices include wear leveling schemes that reduce the number of P/E cycles for given blocks of memory, and to spread out the P/E cycles over most of the blocks of the memory device. Thus, to continue the above page overwrite example, reducing P/E cycles for the block of memory can involve writing the backed-up data with revisions to the page of memory to a second block of memory, other than the block in which the page resides. While this involves writing to two blocks of memory, it removes the erase process to the first block, reducing overall memory operations involved in overwriting the page of memory from two block operations (e.g., erasing the block, re-writing the block), to one block operation (e.g., writing to the second block). In this case, a logical to physical (L2P) mapping table is maintained and updated by a memory controller to keep track of the new location of the backed-up data with revisions. Although this wear leveling scheme reduces P/E cycles for the NAND memory, the L2P increases controller overhead, including memory and processes.

Generally, a small page size implies that a larger L2P memory is needed for the increased mapping needs. Since L2P information is stored in a DRAM, and L2P memory is proportional to the total density divided by number of pages in the device, small page size means a larger DRAM is needed which increases the cost of the system. Large page size decrease the cost, but also decrease system performance as extraneous data is copied as an entire page needs to be transferred to get just a subset of data on the page. This decreased system performance is especially noticed during partial write operations where the whole page has to be merged with the host data and rewritten to another page.

With RRAM however, since the memory can be overwritten without first being backed up and therefore does not need the L2P mapping table, controller overhead resources are vastly reduced. Furthermore, RRAM has shorter access times with a read time of around 1 μs, whereas NAND FLASH has a read time of around 25 μs. These attributes of RRAM enable an RRAM based storage device to use two smaller registers of 512 bytes to mimic a larger page size. In this way, since no L2P mapping table is needed, system cost is greatly reduced and the data transfer is fast and efficient as smaller page sizes means less extraneous data is copied and/or transferred.

To this and related ends, the subject disclosure provides a memory array comprising memory cells formed of a two-terminal memory technology. Examples of the two-terminal memory technology include resistive memory (e.g., resistive-switching memory cell), ferromagnetic memory, phase change memory, magneto-resistive memory, organic memory, conductive bridging memory, and so on. Further details as to specific embodiments are included in the applications incorporated by reference, above. The two-terminal memory technology can facilitate writing to and rewriting to a memory location without first erasing a block of memory in which the memory location resides. In some aspects of the subject disclosure, disclosed memory devices can write to the memory location without first erasing the memory location itself.

In one or more other embodiments, a disclosed memory array can be implemented in a three-dimensional stack arrangement. The three-dimensional stack arrangement can be comprised of multiple two-dimensional memory arrays (e.g., a two-dimensional NAND array, a two-dimensional NOR array, or the like), for instance. In at least one disclosed aspect, the three-dimensional stack arrangement can comprise a pair of two-dimensional memory arrays, stacked in a third dimension. In another aspect, the three-dimensional stack arrangement can comprise four two-dimensional memory arrays, stacked in the third dimension. In yet other aspects, other numbers of two-dimensional memory arrays (e.g., three, five, six, seven, and so on) can be stacked into the third dimension to provide the three-dimensional stack arrangement. As used herein, "stack" refers to the integrated layers on a single monolithic device.

In at least one embodiment, the subject disclosure provides a solid state non-volatile memory storage drive that can be removably connected to and from a host computing device, and comprised of two-terminal memory cell technology. The two-terminal memory cell technology can include resistive-switching memory in some aspects (e.g., resistive random access memory, or the like). In one embodiment, the storage drive can have an 8 bit memory channel with 200 MB/s transfer rate, and between 1 and 8 devices per channel. Alternatively, or additionally, the storage drive can have one or more of the following features: a clock rate of about 100 megahertz, a bus width of 8 bits, a page size of about 4 KB (4096 bytes), a shift time of about 20 μs, a shift time (e.g., shift time+25% OH) of about 25 μs, a program time of about 28 μs, or a maximum transfer rate of about 160 MB/s.

Referring now to the drawings, FIG. 1 illustrates a schematic diagram of an example memory architecture 100 according to one or more aspects of the subject disclosure. Memory architecture 100 can be a subset of a memory array incorporated as part of a non-volatile, solid state memory storage device in some disclosed aspects. For example, memory architecture 100 can be a sub-block of a block of memory, where the sub-block comprises global wordlines of the block of memory, and a subset of bitlines of the block of memory that share a set of common local wordlines that are exclusive to the sub-block of the block of memory.

Memory architecture 100 can comprise a set of bitlines 102. Set of bitlines 102 comprises individual bitlines $BL_0$, $BL_1$, $BL_2$, ..., $BL_X$, where X is a positive integer greater than one. Intersecting set of bitlines 102 is a set of wordlines 104. Set of wordlines 104 comprises individual wordlines $WL_0$, $WL_1$, ..., $WL_N$, where N is a positive integer greater than one. In one embodiment, X can be an integer equal to 8 and N can be an integer equal to 512; however, the subject disclosure is not so limited and X and N can have other suitable values.

As mentioned above, set of bitlines 102 can be associated with a sub-block of a block of memory, such that set of bitlines 102 share a set of local wordlines 108 that are exclusive to the sub-block of the block of memory. Respective ones of the set of local wordlines 108 are connected to a group of memory cells 106. Memory cells 106 have a first terminal connected to one of set of bitlines 102, and a second terminal connected to one of set of local wordlines 108. Local wordlines 108 are connected to a source line 112 by respective wordline select transistors 110. Each wordline select transistor 110 is positioned to electrically connect (when activated, or in a conducting state) or electrically disconnect (when deactivated, or in a resistive state) respective ones of the local wordlines 108 with/from source line 112. Respective wordline select transistors 110 can be gated transistors (e.g., single gate, floating gate, and so on) in some embodiments. Respective gates of wordline select transistors 110 are connected to and controlled by respective ones of set of wordlines 104, as depicted.

Application of a suitable electrical signal to a selected one of bitlines 102 and a selected one of local wordlines 108 can facilitate performing memory operations on a target one(s) of memory cells 106. Applying the electrical signal to the selected one of local wordlines 108 can be implemented by source line 112 and an associated one of set of wordlines 104 (e.g., see FIG. 2, infra). Memory cell operations that can be implemented utilizing the circuitry of memory architecture 100 can comprise activating, deactivating, programming, re-programming, erasing, etc., the target memory cell(s) 106, by applying a suitable electric signal to one of bitlines 102 and one of local wordlines 108 connected to the target memory cell(s) 106.

Figure 2:
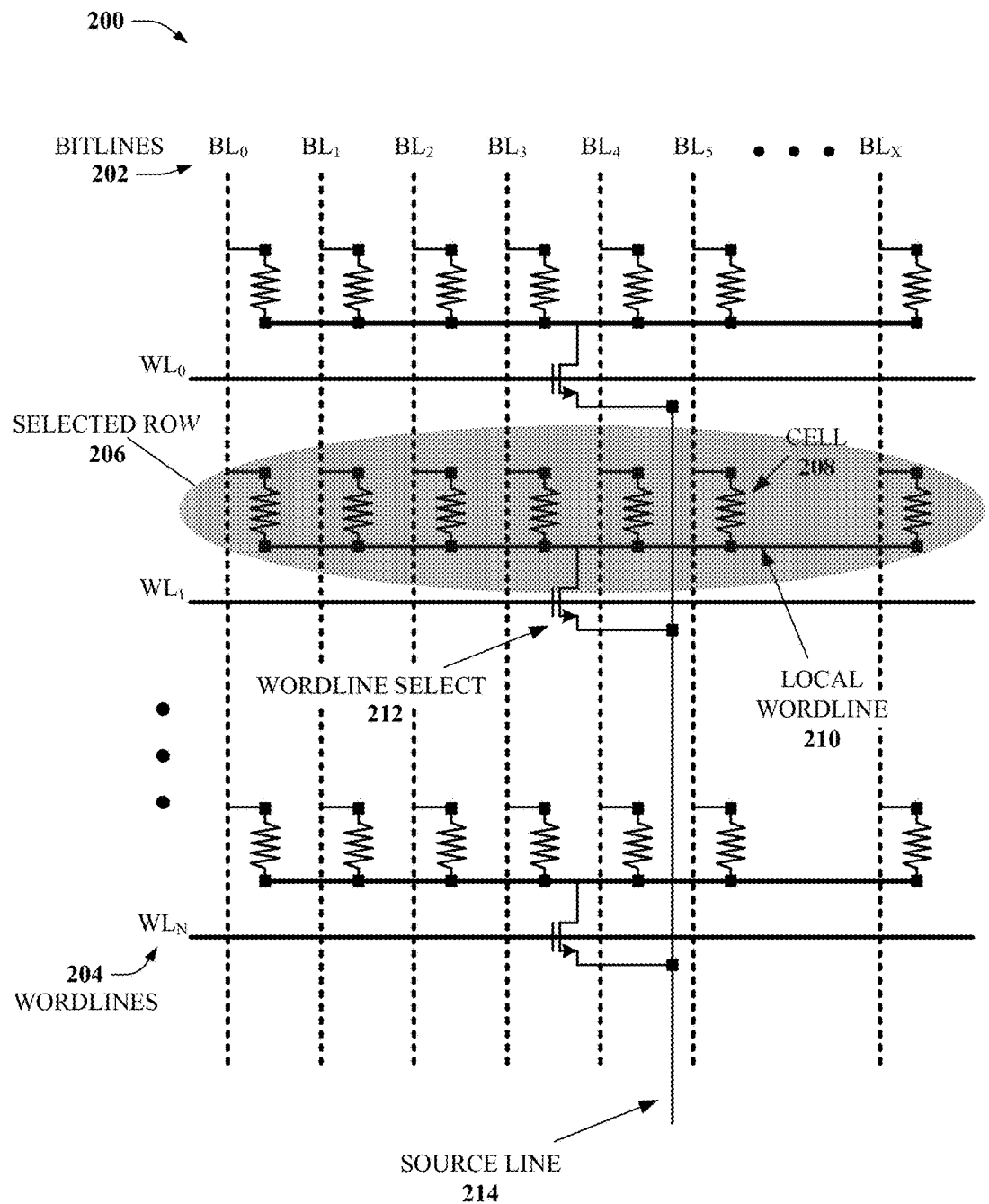
FIG. 2 depicts a schematic diagram of the example memory circuit of FIG. 1 comprising a row of memory selected for a memory operation, in some aspects.

FIG. 2 illustrates a schematic diagram of an example memory architecture 200 according to one or more embodiments of the subject disclosure. In at least one embodiment, memory architecture 200 can be substantially the same as memory architecture 100 of FIG. 1, supra. But the subject disclosure is not so limited; for instance, in another embodiment memory architecture 100 can be programmed, overwritten or erased according to a different memory operation process differently from memory architecture 200.

Memory architecture 200 can comprise bitlines 202 of a memory device, including bitlines $BL_0$, ..., $BL_X$, and wordlines 204 of the memory device, including wordlines $WL_0$, ..., $WL_N$, as shown schematically by FIG. 2. Memory architecture illustrates bitlines 202 and wordlines 204 in a perpendicular arrangement (e.g., in a two-dimensional crossbar array), though the subject disclosure is not limited to such an arrangement. In some embodiments, memory architecture 200 can be a part of a three-dimensional memory arrangement, in which multiple two-dimensional arrays (e.g., including memory architecture 200) of intersecting bitlines and wordlines are stacked in a third dimension.

Generally, memory architecture 200 comprises one memory cell 208 for each intersection of one of bitlines 202 and one of wordlines 204. However, respective memory cells 208 need not be physically located where a wordline 204 intersects a bitline 202. As depicted, a set of local wordlines 210 can be interspersed between respective wordlines 204. Respective groups of memory cells 208 can comprise those memory cells 208 that share a terminal contact at one of the local wordlines 210. For instance, the group of memory cells 208 associated with a selected row 206 can each have one terminal connected to the one of the local wordlines 210 associated with the selected row 206. Additionally, respective memory cells 208 in the group of memory cells 208 can have a second terminal that is connected to one of bitlines 202. In this manner, by activating a selected row 206, and applying an operation voltage at one of selected bitlines 202, a single memory cell 208 of a group of memory cells (e.g., memory cells 208 connected to the local wordline 210 on selected row 206) can be targeted for a memory operation (e.g., read, write, erase, overwrite, etc.).

A set of wordline select transistors 212 can be configured to electrically connect or electrically disconnect respective associated local wordlines 210 with a source line 214. An associated one of wordlines 204 can be connected to a gate of respective wordline select transistors 212. Thus, a suitable activation/deactivation signal applied at wordline $WL_1$ can activate or deactivate the local wordline 210 associated with selected row 206. When the wordline select transistor 212 connected to wordline 204 $WL_1$ is activated, then the local wordline 210 of selected row 206 and the terminals of the group of memory cells connected to this local wordline 210 are electrically connected to source line 214. This process enables selection of selected row 206. For example, applying an activation signal to wordline 204 $WL_1$ connects the local wordline of selected row 206 to source line 214. Then, by applying a suitable signal to a selected bitline 202 and source line 214, the signal is observed by a memory cell 208 of selected row 206 having a first contact on the selected bitline 202.

Figure 3:
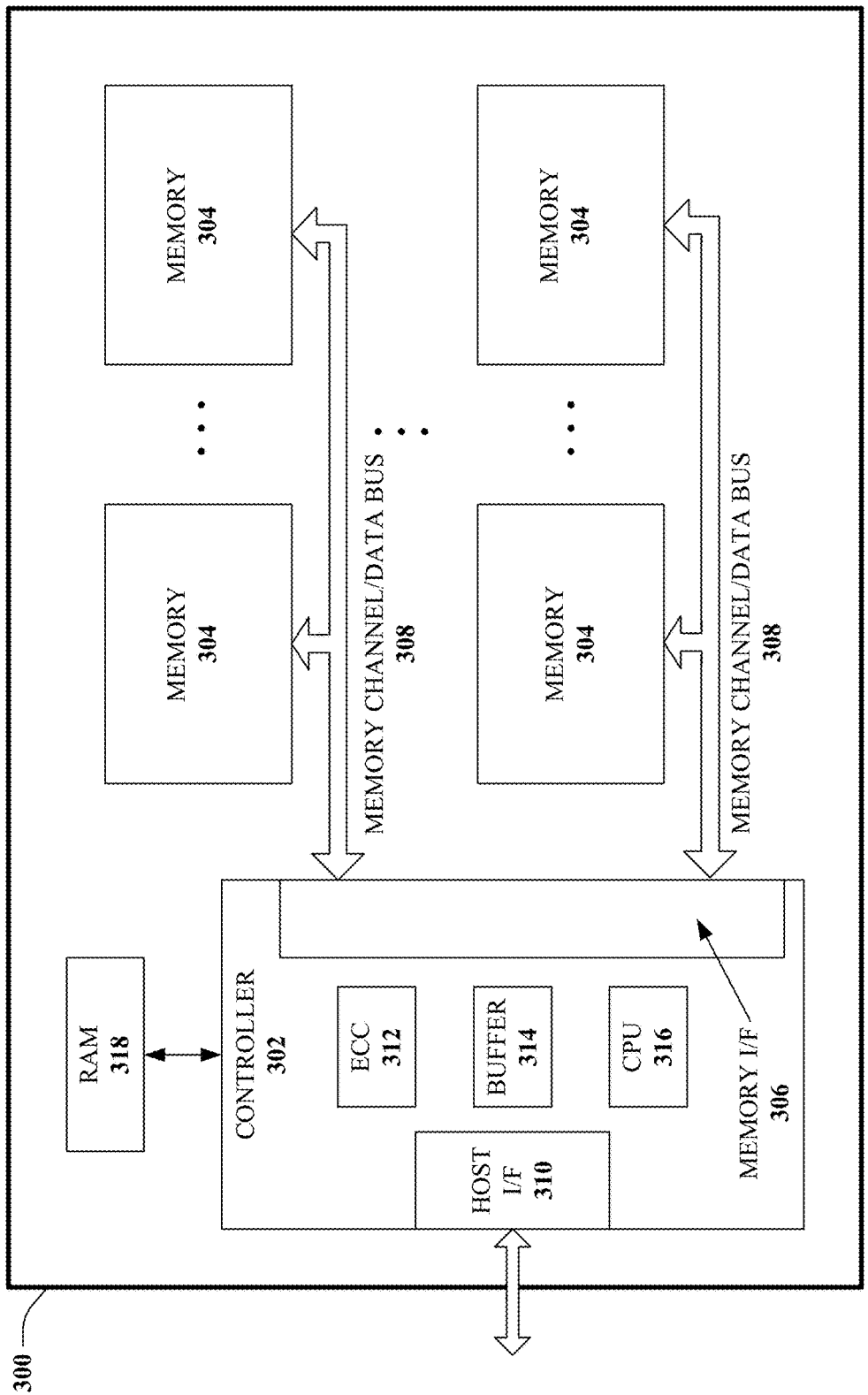
FIG. 3 depicts a block diagram of an example electronic memory device having real-time read and write capability, in one or more embodiments.

FIG. 3 depicts a block diagram of an example memory device 300 according to one or more disclosed embodiments of the subject disclosure. In some embodiments, memory device 300 can be a removable storage device, such as a FLASH device, which can be connected to or disconnected from a host computing device (e.g., a computer, a laptop, a terminal, a smart phone, a table computer, etc.) by way of a communication interface (e.g., a universal serial bus [USB] interface, and so forth). In other embodiments, memory device 300 can be deployed on a hardware card for connecting with a server device or other computing device. In still other embodiments, memory device 300 can be a stand-alone device configured to communicate with a remote host device via a suitable remote communication platform (e.g., a wireless interface, a cellular interface, a satellite interface, a wired interface, an Ethernet interface, a broadband over power line interface, or the like, or a suitable combination thereof).

In various embodiments, memory device 300 can be operable to electronically communicate with the host computing device over a suitable communication interface. In at least one embodiment, memory device 300 can include a power source; however in another embodiment, memory device 300 can be powered via the communication interface. In at least one alternative embodiment, memory device 300 can include the power source, and also acquire power via the communication interface. In still other embodiments, memory device 300 can be integrated within a computing device, or can operate exclusive of a host computing device. One of skill in the art will appreciate other suitable configurations for memory device 300, which are considered within the scope of the subject disclosure. To this end, memory device 300 can include additional components other than those depicted by FIG. 3, as suitable (e.g., including a multi-purpose processing component, including applications configured to operate with the multi-purpose processing component utilizing data stored on memory device 300, and so on).

Memory device 300 can comprise a memory controller 302. Memory controller 302 can be configured to communicate with a host computing device over a host interface 310. Host interface 310 can operate to receive host commands from the host computing device related to memory modules 304 on memory device 300. Suitable host commands can include a write command, a read command, an erase command, an overwrite command, or the like, or suitable combinations thereof. Additionally, host interface 310 can be configured to receive data from the host computing device related to a host command, or provide data stored on one or more memory modules 304 to the host device in response to a host command.

In various embodiments, memory controller 302 can further comprise a memory interface 306 configured to communicate with and execute memory operations in conjunction with memory modules 304 over one or more memory channels/data busses 308 (referred to hereinafter as memory channels 308). In at least one aspect, memory channels 308 can be 8-bit channels, however the various embodiments are not limited to this aspect(s), and one or more other size channels can be employed for memory channels 308 instead. In some embodiments, memory controller 302 can perform low-level memory operations with memory modules 304, including write, erase, read, etc. In other embodiments, memory controller 302 can perform high-level memory functions with blocks of memory 302, where respective memory controllers (not depicted) within respective memory modules 304 translate high-level memory functions to low-level memory functions (e.g., read, write, erase, etc.), and carry out the low-level memory functions.

In various disclosed embodiments, memory controller 302 can further comprise an error correction component 312 incorporating an ECC. In at least one embodiment, the ECC can be a relatively non-complex ECC (e.g., a Bose-Chaudhuri [BCH] code, a Reed-Solomon [RS] code, or the like), because of the overwrite capability and write amplification (WA) value of one for memory modules 304. In other embodiments, the ECC can alternatively, or in addition, incorporate more complex algorithms, such as a low density parity check [LDPC] code, or the like. Memory controller 302 can also comprise a buffer memory 314 and central processing unit 316 in an embodiment, for performing memory operations on memory modules 304. In still other embodiments, memory device 300 can comprise a RAM 318 (e.g., dynamic RAM, or other suitable RAM) for temporary storage, high speed operating memory, or other purposes that would be evident to one of ordinary skill in the art, which are considered within the scope of the subject disclosure.

Memory modules 304 can comprise an array(s) of memory cells for storing digital information, control hardware for accessing and writing the information, buffering memory (e.g., RAM, or the like) to facilitate control hardware processes and memory translation operations, cache, or the like, or a suitable combination thereof. In some embodiments, the array(s) of memory cells can comprise a crossbar arrangement of two-terminal memory cells (e.g., resistive memory cells, resistive-switching memory cells, and so on). In the crossbar arrangement, intersecting wordlines and bitlines of the memory arrays can be configured to facilitate applying an electrical signal to one or more of the two-terminal memory cells. Furthermore, memory modules 304 can comprise a two-terminal memory cell technology that can be directly overwritten, having a WA value of one. Examples of such two-terminal memory cell technology can include, but are not limited to, resistive memory cells such as resistive-switching memory, resistive random access memory, or the like, or a suitable combination thereof. By utilizing a crossbar arrangement of two-terminal memory cells having a WA value of one, the inventors of the subject application believe memory device 300 can provide great flexibility in performing memory operations. Particularly, memory modules 304 can directly overwrite selected memory cells of respective arrays of memory cells. The inventors believe that memory device 300 can mitigate or avoid what is, in their opinion, a drawback of NAND FLASH, the inability of NAND FLASH to directly overwrite a memory cell without first erasing a block of memory in which the memory cell resides. Accordingly, memory device 300 can have a significant advantage in operational efficiency, memory retention, memory longevity, read and write speeds, as well as other characteristics.

In alternative or additional embodiments of the subject disclosure, an array(s) of memory within one or more of memory modules 304 can respectively comprise multiple blocks of memory, wherein at least one of the respective blocks of memory comprise multiple sub-blocks of memory. Example schematic diagrams of a sub-block of memory are depicted by FIGS. 1 and 2, supra. A sub-block of memory is associated with one subset of the bitlines of an associated one of the blocks of memory. The number of the bitline subsets can vary according to different embodiments, as can the number of bitlines in a given subset of the bitlines. Each sub-block and associated subset of the bitlines has an associated set of local wordlines that can be exclusive to the sub-block. Each sub-block also comprises a number of groups of two-terminal memory cells equal to a number of wordlines of the memory modules 304. A single group of memory cells within a sub-block comprises two-terminal memory cells that are connected at one respective end thereof to one local wordline of the sub-block of memory. In addition, the memory cells of each group within a sub-block are connected at another respective end thereof to one bitline of the bitline subset of that sub-block. Because each group of memory cells share a common terminal at one local wordline, leakage currents, also called sneak path currents, can occur within a sub-block of memory along respective local wordlines. For instance, referring back to FIG. 2, supra, if a voltage is applied to bitline $BL_0$ to operate on the left-most two-terminal memory cell in selected row 206, and other bitlines $BL_1$ through $BL_X$ observe a different voltage (e.g., zero volts, or are floating), the common path along the local wordline 210 of selected row 206 will allow sneak path currents to occur between bitline $BL_0$ and each of bitlines $BL_1$ through $BL_X$. These sneak path currents can reduce sensing margin of a sensor 322, among other effects.

Figure 4:
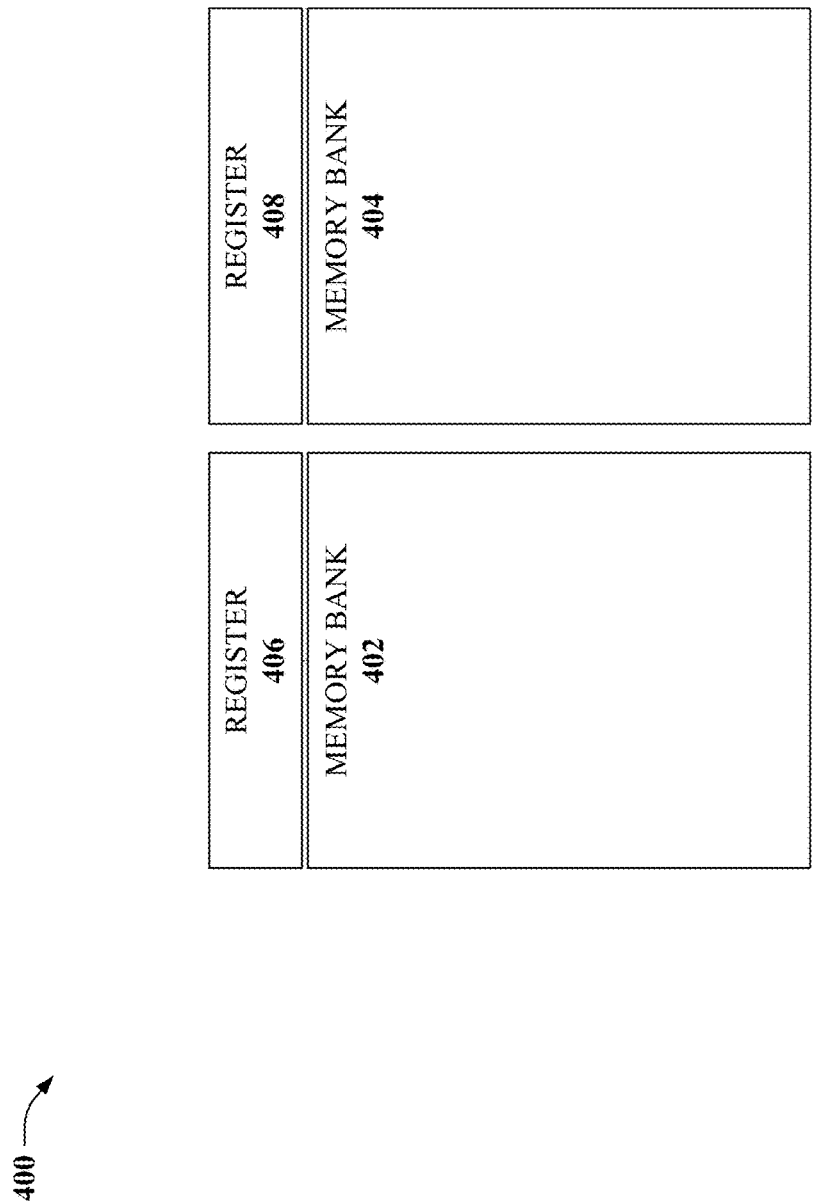
FIG. 4 illustrates a schematic diagram of an example of two memory registers in an embodiment.

Turning now to FIG. 4, illustrated is a schematic diagram of an example of two memory registers in an embodiment of the subject disclosure. Schematic 400 includes a memory bank 402 and a memory bank 404 that are associated with registers 406 and 408 respectively. The memory banks 402 and 404 collectively can comprise the solid state non-volatile memory storage drive. In some embodiments, memory banks 402 and 404 comprise the same set of two terminal memory elements, and in other embodiments the memory banks 402 and 404 are separate sets of two terminal memory elements.

Registers 406 and 408 can be memory data registers that contain the data ready to be copied to a host after a fetch from the memory banks 402 and 404 respectively. Registers 406 and 408 can each fetch from either memory bank 402 or 404 in some embodiments. Registers 406 and 408 can also be two-way registers in that in response to a write instruction from a host, the data to be written to the memory banks 402 and 404 is placed into registers 406 and 408 from a register associated with the host, and then registers 406 and 408 place the data in the memory banks 402 and 404.

Figure 5:
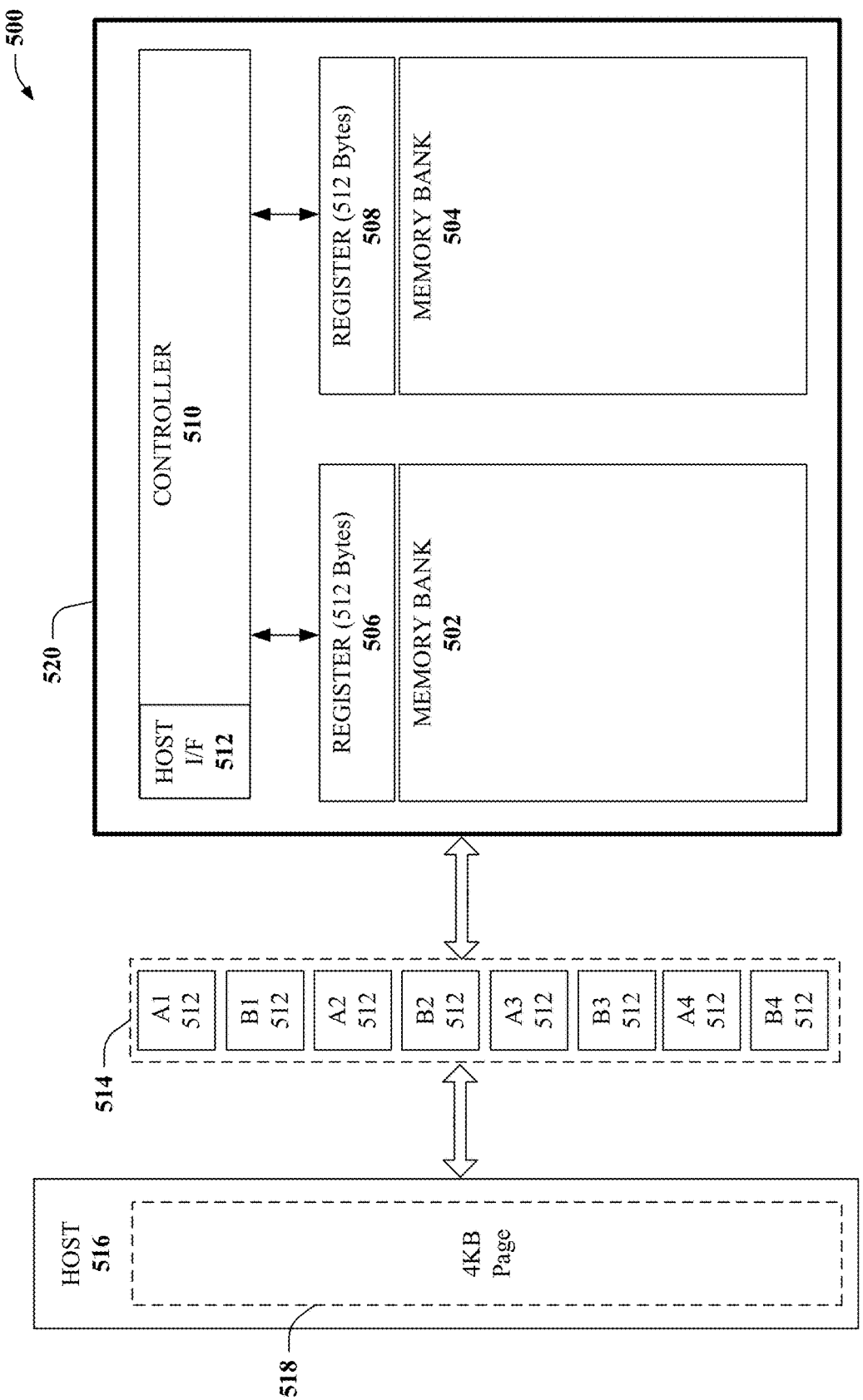
FIG. 5 illustrates a schematic diagram of an example of a system that transfers data using a configurable page size in an embodiment.

Turning now to FIG. 5, illustrated is a schematic diagram of an example of a system that transfers data using a configurable page size in an embodiment as shown herein. System 500 includes a solid state non-volatile memory storage drive 520 that is communicably coupled to a host device 516. Storage drive 520 can contain one or more memory banks (e.g., memory banks 502 and 504). In some embodiments, memory banks 502 and 504 each contain the entire set of two-terminal memory elements of the storage drive 520. In other embodiments, memory banks 502 and 504 comprise respective sets of two-terminal memory elements and together collectively comprise the two-terminal memory elements of storage device 520.

Register 506 and register 508 can be memory data registers that contain the data ready to be copied to a host after a fetch from the memory banks 502 and 504, and can also contain the data to be written to memory banks 502 and 504 in response to a write access. Registers 506 and 508 can each be at least as large as 512 bytes. It is to be appreciated that while FIG. 5 shows two memory banks with two corresponding registers, in other embodiments, other combinations and numbers of memory banks and registers are possible in accordance with various embodiments of the subject disclosure. The registers 506 and 508 can collectively comprise the page buffer of the storage device 520.

Controller 510 can be provided to communicate with host device 516 and execute memory operations on the storage drive 520. In some embodiments, memory controller 510 can perform low-level memory operations including write, erase, read, etc in conjunction with memory registers 506 and 508. In other embodiments, memory controller 510 can perform high-level memory functions with memory banks 502 and 504. Controller 510 can also include a host interface 512 that facilitates communications with host 516.

Controller 510, via the host interface 512 can receive a read access request from host device 516. Based on the host device 516 and applications, programs, etc, being executed by host device 516, the read access request can be associated with a particular page size. The page size for the host is the number of the fixed length contiguous memory cells in a row of memory for a defined block of memory, and is the smallest unit of data for memory allocations and transfers between main memory (of the host) and storage drives. Different host applications and host devices have different page sizes. Controller 510 can determine the page size associated with the read access request and transfer data from the memory banks 502 and 504 to the host device 516 and using the two or more registers 506 and 508, can mimic the page size of the read access request.

Memory controller 510 can first read data in register 506 and then transfer the data in register 506 to host 516. While register 506 is transferring the data, register 508 can read the data, and then transfer the data to host device 516 when register 506 has completed transferring the data. Controller 510 can transfer data seamlessly using the two registers, one after the other, until an amount of data transferred is equal to the page size associated with the read access request.

In an example, if the page size of a page 518 of host 516 is 4 KB, and registers 506 and 508 are each 512 bytes, controller 510 will iteratively transfer data from registers 506 and 508 four times each until 4 KB of data has been transferred. An example of this is shown in FIG. 5 as virtual page 514. Virtual page 514 contains segments of data A1 and B1 that are the first iteration of data transferred from registers 506 and 508. Segments A2 and B2, and A3 and B3 and A4 and B4 are the second, third and fourth iterations of data transferred from registers 506 and 508. Each of the segments are 512 bytes, and collectively comprise 4 KB that matches the size of the page 518 associated with the host device 516 and read access request. A read access time for each data lookup by the registers can be around 1 μs while the transfer time for each segment is around 1.28 μs.

When performing a read access with configurable page size, a first read is performed on the first register (e.g, register 506) that takes about 1 μs. Then, data transfer is initiated that takes 1.28 μs. While the data transfer is proceeding, a read access is performed on register 508 which also takes 1 μs. Since this time is less than the data transfer time, by the time first segment A1 is transferred, B1 is ready to be transferred. Thus, in this example, the total time needed to transfer the page is 11.24 μs (1.28 μs*8+1 μs) which is the first read time plus the total time to transfer segments A1-B4. This is to be contrasted with read time of memory that does not have a configurable page size which can often be much higher (e.g., NAND Flash is around 25-50 μs).

In other embodiments, the controller 510 can be configured to mimic page sizes of different sizes. For instance, if the page size is 8 KB or 16 KB, the controller 510 can iteratively copy data from registers 506 and 508 16 times or 32 times respectively. In each circumstance, host device 516 receives the data as if it were one page that was transferred.

In an embodiment, a read time of the memory banks 502 and 504 is less than a transfer time of the memory registers 506 and 508. In other embodiments, the read time of the memory banks 502 and 504 is greater than a transfer time of the memory registers 506 and 508 where the read transfer would not be gapless, but the pipelining would still have a positive impact on performance.

Since the read access time of the two-terminal memory elements is far faster than traditional NAND FLASH, increasing the number of reads adds a relatively small amount of delay, but the performance and efficiency of the memory transfers (efficiency increases due to highly reduced extraneous data transfer) are greatly increased, while eliminating the costly L2P memory that increases the price of the system.

In various embodiments of the subject disclosure, controller 510 can determine the page size associated with the read access request and determine the number of iterations of data transfers from registers 506 and 508 that need to be performed. Once the number of iterations is performed, controller 510 can cease the data transfers or otherwise inform page buffer and/or registers 506 and 508 to cease transferring data. Controller 510 or the page buffer can increment a counter, and when the counter reaches the determined number of iterations, the data transfers cease.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a deposition process can comprise a fill or etching process, an anneal process, or the like, or vice versa, to facilitate deposition, filling or etching of memory cell layers by way of an aggregate process. Components of the disclosed architectures can also interact with one or more other components not specifically described herein but known by those of skill in the art.

Figure 6:
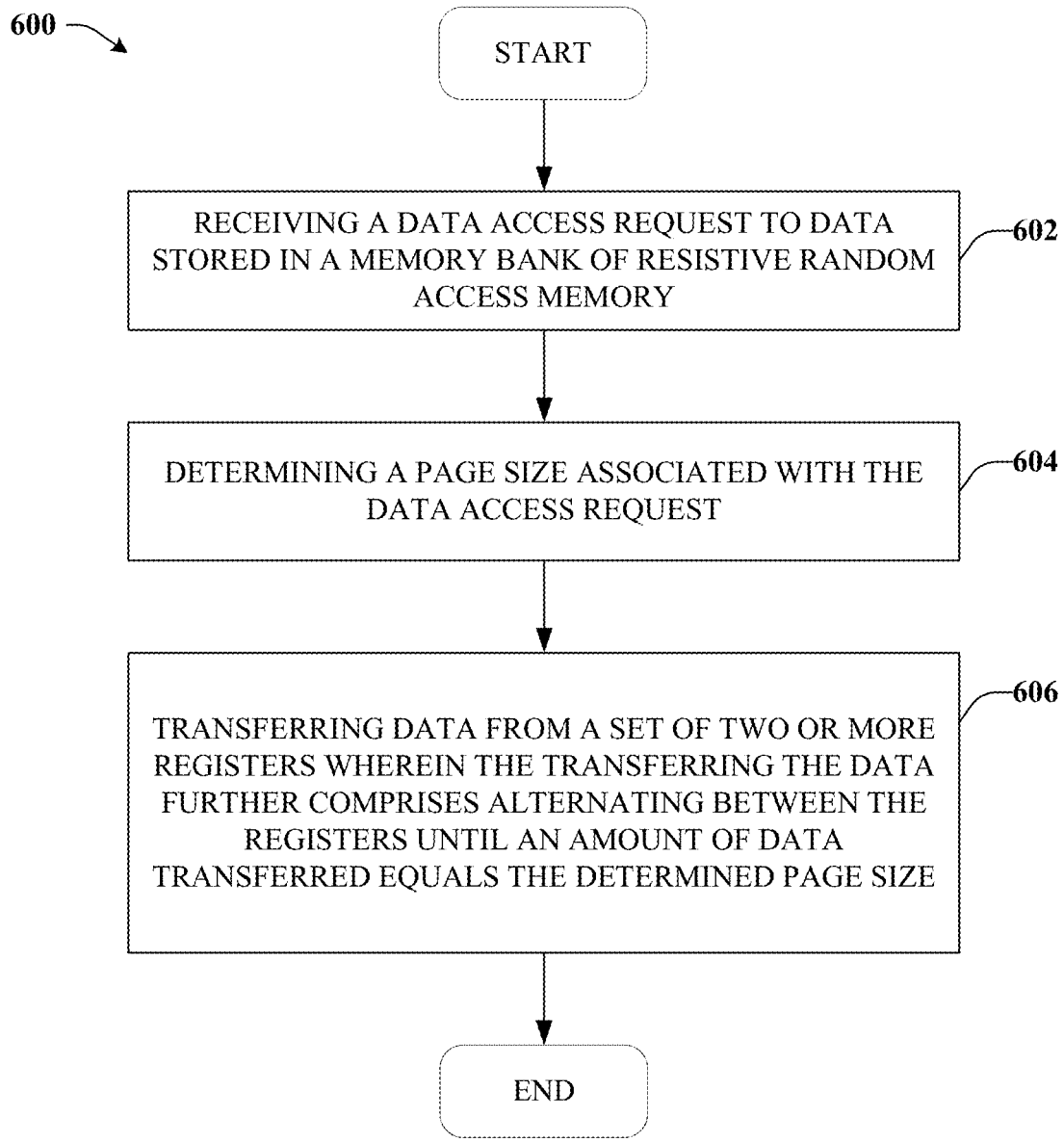
FIG. 6 illustrates a flowchart of an example method for transferring data with a configurable page size according to one or more embodiments disclosed herein.
Figure 7:
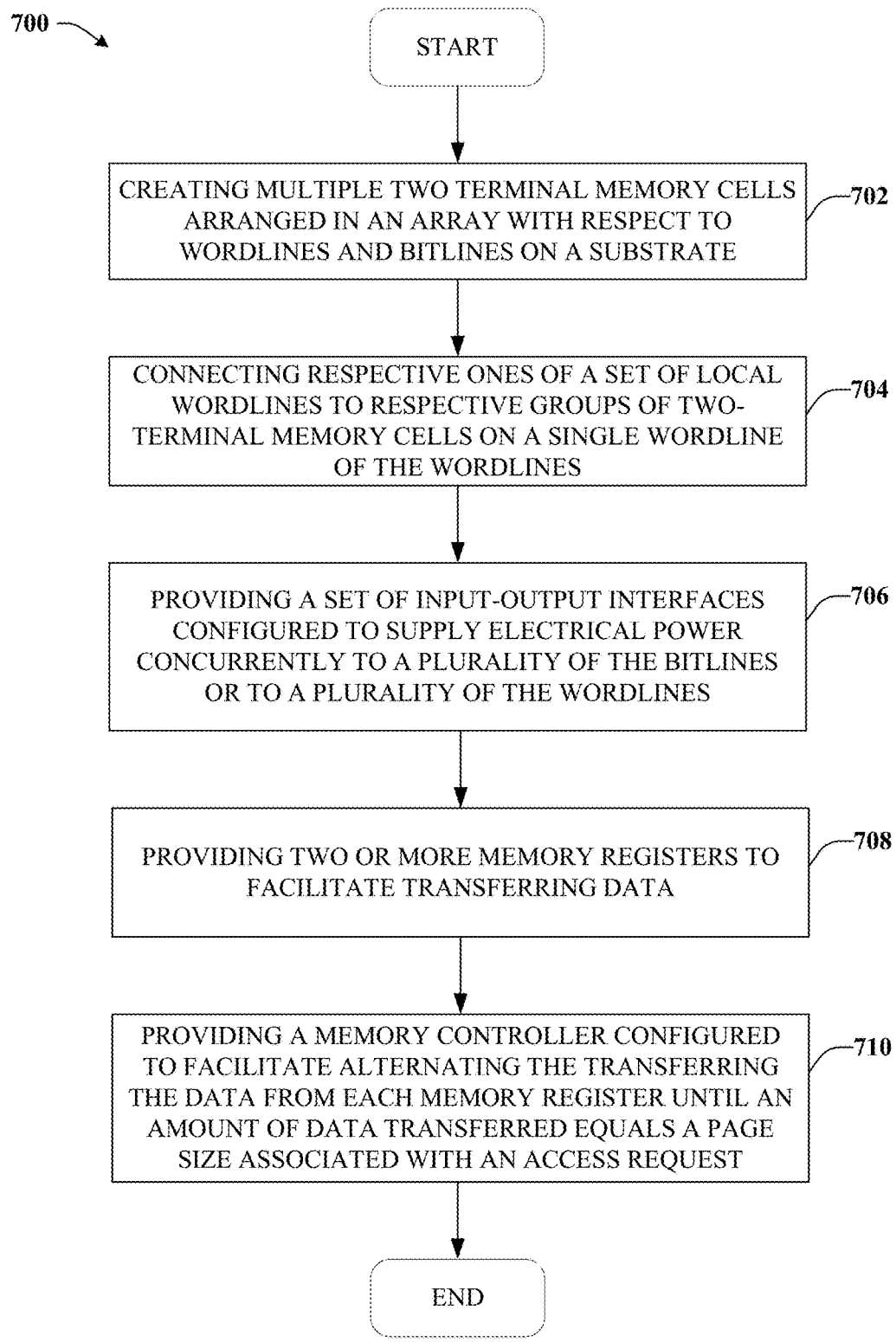
FIG. 7 depicts a flowchart of a sample method for fabricating a digital storage device that uses a configurable page size in further embodiments.
Figure 8:
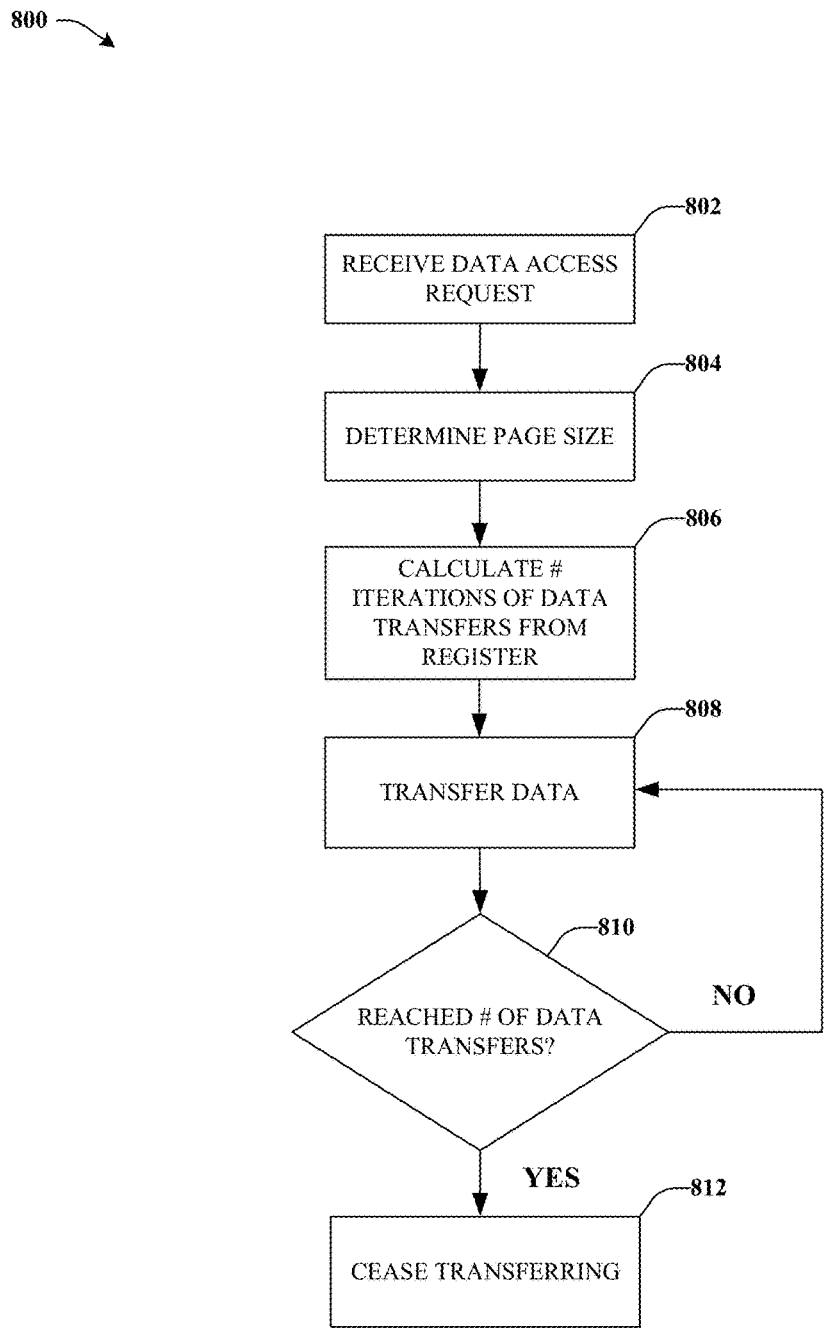
FIG. 8 illustrates a flowchart of an example method for transferring data using a configurable page size according to other embodiments.

In view of the exemplary diagrams described supra, process methods that can be implemented in accordance with the disclosed subject matter will be better appreciated with reference to the flow charts of FIGS. 6, 7, and 8. While for purposes of simplicity of explanation, the methods of FIGS. 6, 7, and 8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

Turning now to FIG. 6, a flowchart of an example method for transferring data with a configurable page size according to one or more embodiments disclosed herein is illustrated. Flowchart 600 can begin at 602, where a data access request to data stored in a memory bank of resistive random access memory is received. The data access request can be from a host that is communicably coupled to a storage device comprising the memory bank of resistive random access memory.

At 604, a page size associated with the data access request can be determined. The page size can be based on the host device that is communicably coupled to the storage device. The page size can also be based on an application that issued the data access request. In some embodiments, once a page size is determined, a controller can determine the number of iterations of data transfers that need to be performed to equal the page size based on the size of the registers on the storage device. Once determined, at 606, the data is transferred from a set of two or more registers, each of which can have 512 bytes, where the transferring of data further comprises alternating between the two or more registers until an amount of data transferred equals the determined page size.

Turning now to FIG. 7, illustrated is a flowchart of a sample method for fabricating a digital storage device that uses a configurable page size in further embodiments as disclosed herein. At 702, method 700 can comprise creating multiple two terminal memory cells arranged in an array with respect to wordlines and bitlines on a substrate. In some embodiments, arranging the resistive memory cells into multiple blocks of memory can further comprise arranging the resistive memory cells in respective ones of the multiple blocks of memory cells into multiple sub-blocks of memory cells.

At 704, respective subsets of local wordlines can be connected to respective groups of two terminal memory cells on a single wordline of the wordlines. At 706, a set of input/output interfaces can be provided that are configured to supply electrical power concurrently to a plurality of the bitlines or to a plurality of the wordlines.

At 708, two or more memory registers of 512 bytes each can be provided to facilitate transferring data to and from a host device. The memory registers can be memory data registers that temporarily hold data to be read or written to the storage device. At 710, a memory controller can be provided to facilitate alternating the transferring the data from each memory register until an amount of data transferred equals a page size associated with an access request.

With reference now to FIG. 8, illustrated is a flowchart of an example method for transferring data using a configurable page size according to other embodiments. The flowchart 800 can begin at 802 where a data access request is received. The data access request can be a read access request that is received from a host device. The host device can be communicably coupled to a storage device that receives the data access request.

At 804, a page size associated with the data access request can be determined. The page size can be based at least in part on either the host device or application that issued the data access request.

At 806, a number of iterations of data transfers from memory registers on the storage device can be calculated. The number of iterations is based on the size of the registers, number of registers and the page size of the data access request. For instance, in some embodiments, there can be two memory registers of 512 bytes each. If the page size of the data access request is 4 KB, then the number of iterations of data transfers is 4, with each register alternately transferring data.

At 808, the data is transferred, alternating between each memory register and at 810, a determination is made whether or not the amount of data transferred is equal to the page size of the data access request, or whether the number of iterations performed equals the number of calculated iterations. If the number of iterations has not been reached, or the amount of data has not been transferred, the process repeats at 808. If the number of iterations is complete, or amount of data has reached the page size, at 812, the data transferring ceases.

Figure 9:
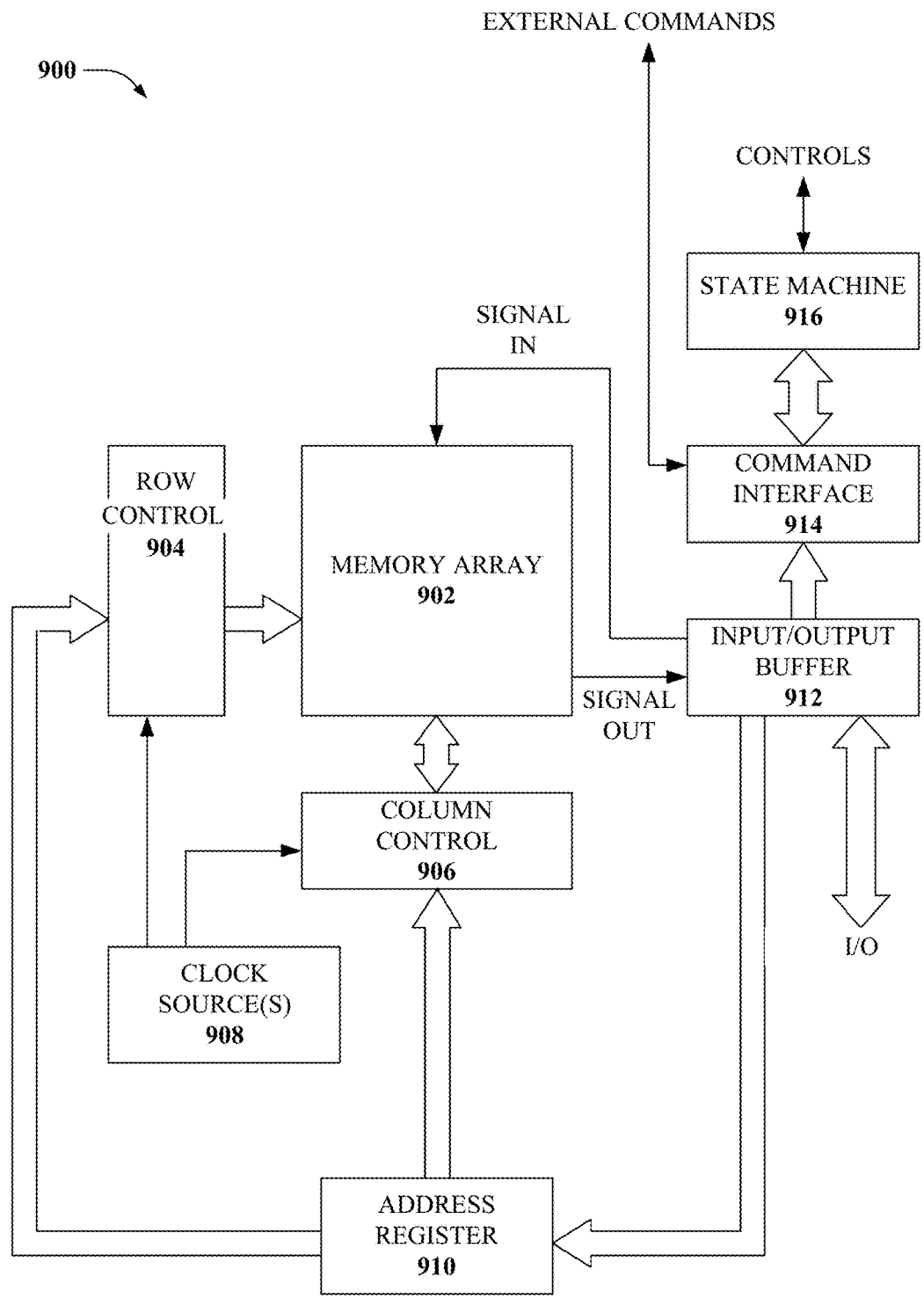
FIG. 9 depicts a block diagram of a sample operating environment for facilitating implementation of one or more aspects disclosed herein.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methods for fabricating or operating such architectures, those skilled in the art will recognize that the subject disclosure also can be implemented in combination with other architectures or process methods. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 9 illustrates a block diagram of an example operating and control environment 900 for a memory cell array 902 according to aspects of the subject disclosure. In at least one aspect of the subject disclosure, memory cell array 902 can comprise a variety of memory cell technology. In at least one embodiment, memory cells of the memory cell technology can comprise conductive silicon activated in-situ upon deposition, as described herein. In another embodiment, memory cell array 902 can store operations configured to cause a device to fabricate conductive silicon activated in-situ upon deposition.

A column controller 906 can be formed adjacent to memory cell array 902. Moreover, column controller 906 can be electrically coupled with bit lines of memory cell array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of memory cell array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row controller 904 and column controller 906. Clock source(s) 908 can further facilitate selection of word lines or bit lines in response to external or internal commands received by operating and control environment 900. An input/output buffer 912 can be connected to an external host apparatus, such as a computer or other processing device (not depicted, but see e.g., computer 802 of FIG. 12, infra) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to memory cell array 902 via signal input lines, and output data is received from memory cell array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of memory cell array 902. State machine 916 receives commands from the host apparatus via input/output buffer 912 and command interface 914, and manages read, write, erase, data input, data output, and similar functionality associated with memory cell array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 9, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
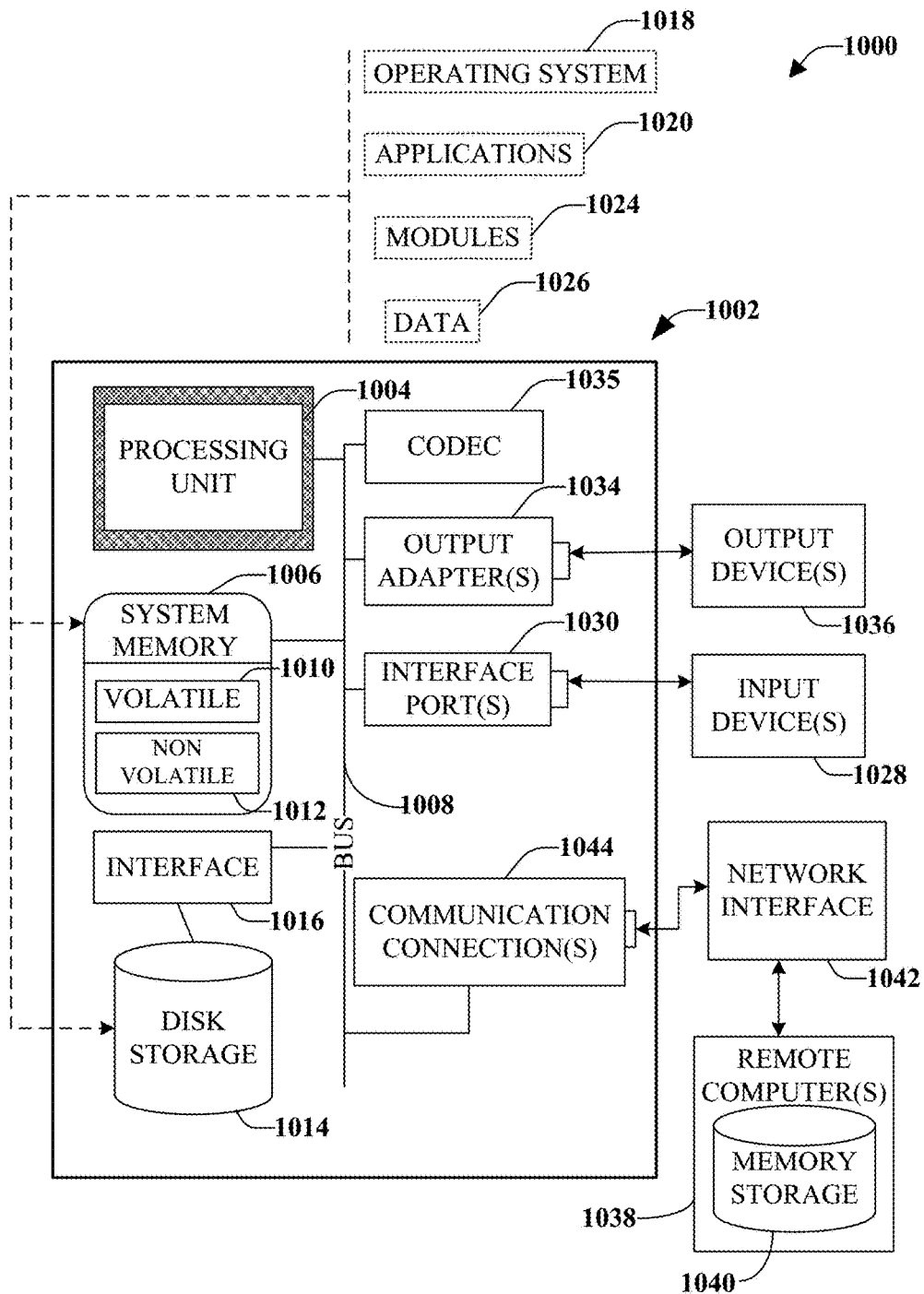
FIG. 10 illustrates a block diagram of an example computing environment that can be implemented in conjunction with various embodiments.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, Wi-Fi (802.11b, g, n, ac, etc), Zigbee, Bluetooth, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A solid state non-volatile memory storage drive, comprising:
    a memory bank of two-terminal memory elements;
    a page buffer comprising a subset of the two-terminal memory elements designated as memory registers; and
    a controller configured to:
        determine a page size associated with a data request from a host, and iteratively, until an amount of data transferred is equal to the page size that is determined,
            alternating amongst the memory registers to concurrently perform at least one read operation and at least one transfer operation, wherein the at least one read operation comprises reading data, associated with the data request, from the memory bank into a memory register of the memory registers, and wherein the at least one transfer operation comprises transferring data, associated with the data request, from another memory register of the memory registers to the host.

2. The solid state non-volatile memory storage drive of claim 1, wherein the two-terminal memory elements are resistive random access memory elements.

3. The solid state non-volatile memory storage drive of claim 1, wherein the controller transfers the data from the memory registers to appear as a single page of data to the host.

4. The solid state non-volatile memory storage drive of claim 1, wherein a read time to read data from the memory bank to the memory register is less than a transfer time to transfer data from the other memory register to the host.

5. The solid state non-volatile memory storage drive of claim 1, wherein the determined page size is a multiple of a number of bytes in each of the registers.

6. The solid state non-volatile memory storage drive of claim 1, wherein the controller determines the page size based on an application executed by the system.

7. The solid state non-volatile memory storage drive of claim 1, wherein the controller determines a number of iterations of data transfers from the memory registers to equal the determined page size.

8. The solid state non-volatile memory storage drive of claim 7, wherein the controller stops transferring data when the number of iterations of data transfers is reached.

9. The solid state non-volatile memory storage drive of claim 8, wherein the controller increments a counter for each data transfer iteration, and ceases data transfers when the counter equals the number of iterations.

10. The solid state non-volatile memory storage drive of claim 1, wherein a read time to read data from the memory bank to the memory register is greater than a transfer time to transfer data from the other memory register to the host.

11. A method, comprising:
    receiving a data access request, from a host, to data stored in a memory bank of resistive random access memory, wherein a subset of the resistive random access memory is designated as a plurality of registers;
    determining a page size associated with the data access request; and
    iteratively until an amount of data transferred is equal to the determined page size:
    alternating amongst registers of the plurality of registers to concurrently perform at least one read operation and at least one transfer operation, wherein the at least one read operation comprises reading data, associated with the data access request, from the memory bank into a register of the plurality of registers, and the at least one transfer operation comprises transferring data, associated with the data access request, from another register of the plurality of registers to the host, and in the absence of a logical to physical mapping for the data stored in the plurality of registers.

12. The method of claim 11, further comprising overwriting a set of data at a second register while a first register transfers another set of data.

13. The method of claim 11, further comprising: transferring the data from the set of registers to appear as if it were a page of data to the host.

14. The method of claim 11, further comprising determining the page size based on an application executed by a system requesting the data.

15. The method of claim 14, wherein the determined page size is a multiple of a number of bytes in each of the registers.

16. The method of claim 11, further comprising determining a number of iterations of data transfers from the registers to equal the page size.

17. The method of claim 16, further comprising incrementing a counter for each data transfer iteration.

18. The method of claim 17, further comprising sending a signal to a page buffer to stop data transfers in response to the counter equaling the number of iterations.

19. A method for fabricating a solid state non-volatile memory storage drive, comprising:

creating multiple two-terminal memory cells arranged in an array with respect to wordlines and bitlines on a substrate;

connecting respective ones of a set of local wordlines to respective groups of two-terminal memory cells on a single wordline of the wordlines;

providing a set of input-output interfaces configured to supply electrical power concurrently to a plurality of the bitlines or to a plurality of the wordlines;

providing two or more memory registers, the two or more memory registers each comprised of respective subsets of the multiple two-terminal memory cells; and providing a memory controller configured to facilitate alternating amongst memory registers of the two or more memory registers to concurrently perform at least one read operation and at least one transfer operation, wherein the at least one read operation comprises reading data, associated with an access request from a host, from the multiple two-terminal memory cells to a memory register of the two or more memory registers, and the at least one transfer operation comprises transferring data associated with the access request from another memory register of the two or more memory registers to the host, until an amount of data transferred equals a page size associated with the access request.

20. The method of claim 19, further comprising arranging the multiple two-terminal memory cells and wordlines and bitlines in a logical NAND or a logical NOR array.

* * * * *